US010379170B2

(12) United States Patent
Nagaoka et al.

(10) Patent No.: US 10,379,170 B2
(45) Date of Patent: Aug. 13, 2019

(54) CELL DETERIORATION DIAGNOSTIC BASED ON INTEGRATED VALUE

(71) Applicant: THE DOSHISHA, Kyoto (JP)

(72) Inventors: Naoto Nagaoka, Kyoto (JP); Naoyuki Yoshioka, Kyoto (JP); Naoya Narita, Kyoto (JP)

(73) Assignee: The Doshisha, Kyoto (JP)

( * ) Notice: Subject to any disclaimer, the term of this patent is extended or adjusted under 35 U.S.C. 154(b) by 0 days.

(21) Appl. No.: 15/552,842

(22) PCT Filed: Feb. 24, 2016

(86) PCT No.: PCT/JP2016/055374

§ 371 (c)(1),
(2) Date: Aug. 23, 2017

(87) PCT Pub. No.: WO2016/136788

PCT Pub. Date: Sep. 1, 2016

(65) Prior Publication Data

US 2018/0038918 A1 Feb. 8, 2018

(30) Foreign Application Priority Data

Feb. 24, 2015 (JP) ................................ 2015-033944

(51) Int. Cl.
*H02J 7/00* (2006.01)
*H01M 10/42* (2006.01)
(Continued)

(52) U.S. Cl.
CPC ...... *G01R 31/392* (2019.01); *H01M 10/0525* (2013.01); *H01M 10/42* (2013.01);
(Continued)

(58) Field of Classification Search
CPC ................ G01R 31/3679; G01R 31/36; G01R 31/3637; G01R 31/3665; H01M 10/0525;
(Continued)

(56) References Cited

U.S. PATENT DOCUMENTS

2010/0052617 A1 3/2010 Aridome
2014/0333265 A1 11/2014 Kinjo

FOREIGN PATENT DOCUMENTS

JP 2007108063 4/2007
JP 2007-178333 7/2007
(Continued)

OTHER PUBLICATIONS

International Search Report in PCT/JP2016/055374, dated May 10, 2016.

(Continued)

*Primary Examiner* — Drew A Dunn
*Assistant Examiner* — Sailesh Thapa
(74) *Attorney, Agent, or Firm* — Kirschstein, Israel, Schiffmiller & Pieroni, P.C.

(57) ABSTRACT

Relatively inexpensive and practical cell deterioration diagnostic method and cell deterioration diagnostic device are provided. A cell deterioration diagnostic method diagnoses cell deterioration of a secondary cell having a transient characteristic. The method includes: a charging step of charging the secondary cell; a calculation step of calculating an integrated value of a potential difference obtained by subtracting a cell internal voltage $V_0$ of the secondary cell from a cell inter-terminal voltage of the secondary cell by integrating the potential difference as the cell inter-terminal voltage converges to the cell internal voltage $V_0$ after completion of charging; and a diagnosis step of diagnosing the cell deterioration of the secondary cell based on the integrated value.

4 Claims, 18 Drawing Sheets

(51) Int. Cl.

| | |
|---|---|
| ***H01M 10/48*** | (2006.01) |
| ***G01R 31/367*** | (2019.01) |
| ***G01R 31/374*** | (2019.01) |
| ***G01R 31/378*** | (2019.01) |
| ***G01R 31/388*** | (2019.01) |
| ***G01R 31/389*** | (2019.01) |
| ***G01R 31/392*** | (2019.01) |
| ***H01M 10/0525*** | (2010.01) |

(52) U.S. Cl.
CPC ......... *H01M 10/48* (2013.01); *H01M 10/486* (2013.01); *H02J 7/00* (2013.01); *H02J 7/008* (2013.01); *G01R 31/367* (2019.01); *G01R 31/374* (2019.01); *G01R 31/378* (2019.01); *G01R 31/388* (2019.01); *G01R 31/389* (2019.01)

(58) Field of Classification Search
CPC .... H01M 10/486; H01M 10/42; H01M 10/48; H02J 7/008; H02J 7/00
See application file for complete search history.

(56) References Cited

FOREIGN PATENT DOCUMENTS

| | | | |
|---|---|---|---|
| JP | 2009250796 | | 10/2009 |
| JP | 2011-54413 | | 3/2011 |
| JP | 2011054413 | * | 3/2011 |
| JP | 2007178333 | * | 7/2012 |
| JP | 2013-239328 | | 11/2013 |
| JP | 2013239328 | * | 11/2013 |
| WO | 2012157747 | | 11/2012 |

OTHER PUBLICATIONS

Okada, et al., Development of Lithium-ion Battery Deterioration Diagnosis Technology, vol. 56, No. 2, pp. 73-76, 2013.
Extended European Search Report in Europe Pat. App. No. 16755532.5, dated Oct. 31, 2018.

* cited by examiner (a) Simple model.

(b) Proposed model.

(a) 1 Hz, 100 sec charging.

(b) 2 kHz, 100 sec charging.

(a) 15 sec charging.

(b) 100 sec charging.

(a) 15 sec charging.

(b) 100 sec charging.

(a) 15 sec charging.

(b) 100 sec charging.

(a) 15 sec charging.

(b) 100 sec charging.

CELL DETERIORATION DIAGNOSTIC BASED ON INTEGRATED VALUE

TECHNICAL FIELD

The present invention relates to a cell deterioration diagnostic method and a cell deterioration diagnostic device for diagnosing cell deterioration of a secondary cell.

BACKGROUND ART

A secondary cell, or a lithium-ion secondary cell in particular, has a small internal impedance and thus has a risk of fire caused by large current at a short-circuit accident. For this reason, voltage ranges of the lithium-ion secondary cell at charging and discharging are strictly regulated, and charging and discharging control is performed by a protection device configured to monitor, for example, voltage, current, and surface temperature, thereby preventing an abnormal operation.

Characteristics of the lithium-ion secondary cell depend on cell deterioration. However, the protection device is unable to diagnose cell deterioration of the lithium-ion secondary cell. For this reason, an accident such as fire of the lithium-ion secondary cell has been occurring despite of the function of the protection device. Prevention of an accident due to cell deterioration requires diagnosis of the cell deterioration and replacement of the lithium-ion secondary cell at an appropriate timing.

A known method of diagnosing cell deterioration of the lithium-ion secondary cell uses a dedicated instrument employing an alternating-current superimposing method. However, this cell deterioration diagnostic method has low versatility because the dedicated instrument is expensive, and furthermore, the lithium-ion secondary cell needs to be removed from an instrument using the cell and connected to the dedicated instrument.

In another known method of diagnosing cell deterioration of the lithium-ion secondary cell, the internal impedance is derived from voltage and current waveforms of the lithium-ion secondary cell in operation, and the cell deterioration is diagnosed based on the internal impedance (refer to Non-Patent Document 1, for example). However, this cell deterioration diagnostic method is not used in practice, because of its high charging rate (SOC) dependency and inaccuracy, for example.

PRIOR ART DOCUMENTS

Non-Patent Document

Non-Patent Document 1: Shuhei Okada and three others, “Development of Lithium-ion Battery Deterioration Diagnosis Technology”, Yokogawa Giho, Yokogawa Electric Corporation, Vol. 56, No. 2 (2013), pp. 27 to 30

SUMMARY OF THE INVENTION

Problems to be Solved by the Invention

The present invention is intended to solve the problems by providing relatively inexpensive and practical cell deterioration diagnostic method and cell deterioration diagnostic device.

Means for Solving the Problems

To solve the problems, a cell deterioration diagnostic method according to the present invention is a cell deterioration diagnostic method of diagnosing cell deterioration of a secondary cell having a transient characteristic, the method including:

a charging step of charging the secondary cell;

a calculation step of calculating an integrated value of a potential difference obtained by subtracting a cell internal voltage of the secondary cell from a cell inter-terminal voltage of the secondary cell by integrating the potential difference as the cell inter-terminal voltage converges to the cell internal voltage after completion of the charging; and a diagnosis step of diagnosing the cell deterioration of the secondary cell based on the integrated value.

In the cell deterioration diagnostic method, it is preferable that:

the calculation step corrects the integrated value by using a correction function that exponentially increases as an ambient temperature of the secondary cell increases, and the diagnosis step diagnoses the cell deterioration of the secondary cell based on the corrected integrated value.

To solve the problems, a cell deterioration diagnostic device according to the present invention is a cell deterioration diagnostic device configured to diagnose cell deterioration of a secondary cell having a transient characteristic, the device including:

a calculation unit configured to calculate an integrated value of a potential difference obtained by subtracting a cell internal voltage of the secondary cell from a cell inter-terminal voltage of the secondary cell by integrating the potential difference as the cell inter-terminal voltage converges to the cell internal voltage after completion of charging of the secondary cell;

a storage unit storing first data related to a cell deterioration characteristic of the integrated value; and a diagnosis unit configured to diagnose the cell deterioration of the secondary cell based on the integrated value calculated by the calculation unit and the first data stored in the storage unit.

In the cell deterioration diagnostic device, it is preferable that:

the storage unit stores a correction function that exponentially increases as an ambient temperature of the secondary cell increases, and second data related to a cell deterioration characteristic of the integrated value corrected by the correction function;

the calculation unit corrects the integrated value through the correction function; and the diagnosis unit diagnoses the cell deterioration of the secondary cell based on the corrected integrated value and the second data.

Effect of the Invention

The present invention can provide relatively inexpensive and practical cell deterioration diagnostic method and cell deterioration diagnostic device.

MODE FOR CARRYING OUT THE INVENTION

Embodiments of a cell deterioration diagnostic method and a cell deterioration diagnostic device according to the present invention will be described below with reference to the accompanying drawings. In the following, a lithium-ion secondary cell is described as an exemplary secondary cell.

[Outline]

A cell deterioration diagnostic method according to an embodiment of the present invention includes (1) a "charging step" of charging of a lithium-ion secondary cell, (2) a "calculation step" of calculating an integrated value of a potential difference obtained by subtracting a cell internal voltage from a cell inter-terminal voltage of the lithium-ion secondary cell by integrating the potential difference as the cell inter-terminal voltage converges to the cell internal voltage after completion of the charging, and (3) a "diagnosis step" of diagnosing cell deterioration of the lithium-ion secondary cell based on the calculated integrated value.

Although described later in detail, the inventor of the present application has found such a characteristic of the lithium-ion secondary cell that the integrated value increases as cell deterioration proceeds. The cell deterioration diagnostic method according to the present embodiment exploits this characteristic to diagnose the cell deterioration of the lithium-ion secondary cell based on the integrated value.

Figure 1:
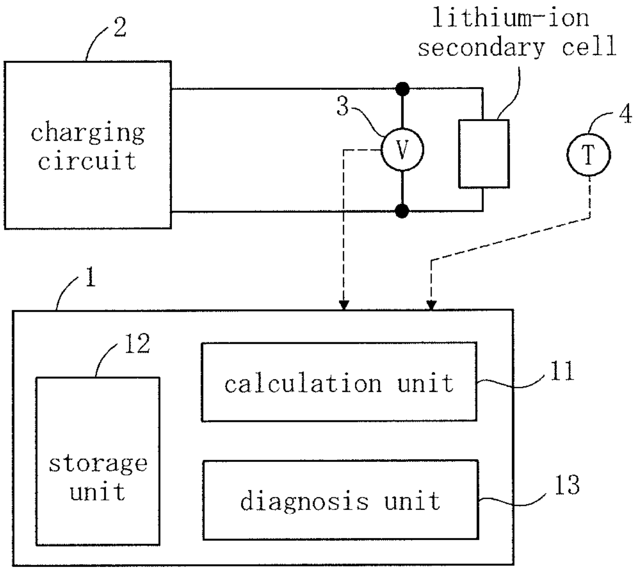
FIG. 1 is a schematic configuration diagram of a cell deterioration diagnostic device according to the present invention.

The cell deterioration diagnostic device according to an embodiment of the present invention is a device for performing the cell deterioration diagnostic method according to the present embodiment, and can be achieved by, for example, a microcomputer. As illustrated in FIG. 1, this cell deterioration diagnostic device 1 according to the present embodiment includes a calculation unit 11 configured to calculate the integrated value based on a signal related to the cell inter-terminal voltage of the lithium-ion secondary cell acquired from a voltage detecting mean 3, a storage unit 12 storing data related to a cell deterioration characteristic of the integrated value, and a diagnosis unit 13 configured to diagnose cell deterioration based on the integrated value calculated by the calculation unit 11 and the data stored in the storage unit 12. In the cell deterioration diagnostic method, the "charging step" is performed by a charging circuit 2 provided separately from the cell deterioration diagnostic device 1, the "calculation step" is performed by the calculation unit 11 of the cell deterioration diagnostic device 1, and the "diagnosis step" is performed by the diagnosis unit 13.

[Lithium-Ion Secondary Cell]

In the present embodiment, the lithium-ion secondary cell is a cylindrical lithium-ion secondary cell CGR18650CH manufactured by Panasonic Corporation. The cell has specifications listed in Table 1 below.

TABLE 1

| | |
|---|---|
| Capacity | 2.25 Ah |
| Nominal Voltage | 3.6 V |
| Weight | 44 g |
| Max Discharge Current | 10 A (25° C.) |

Typically, an SOC is used as an index representing the charging state of the lithium-ion secondary cell. The SOC is the percentage of the amount of stored electric charge amount q(t) relative to a cell nominal capacity (charging capacity) $Q_{Br}$. Expression (1) indicates a defining formula of q(t), and Expression (2) indicates a defining formula of the SOC. In the expressions, $I_B$ represents cell charging current, q(t) represents an electric charge amount at t seconds after start of charging or discharging, and q(0) represents the amount of initially charged electric charge at start of charging or discharging.

[Expression 1]

$$q(t)=\int_0^{\tau} I_B(t)dt+q(0)[C] \tag{1}$$

[Expression 2]

$$SOC(t)=\frac{q(t)}{Q_{Br}}\times 100\ [\%] \tag{2}$$

In the present embodiment, charging is performed at a constant current of 1 [C] (2.25 [A]), and then performed at a constant voltage of 4.2 [V] once the cell inter-terminal voltage of the lithium-ion secondary cell has reached at 4.2 [V] as an upper limit voltage. The SOC is defined to be at 100% when the charging current $I_B$ has decreased to 0.05 [C] through the constant voltage charging. The SOC is defined to be 0% when the cell inter-terminal voltage of the lithium-ion secondary cell has reached at a lower limit voltage of 2.75 [V] through discharging at a constant current of 1 [C] (2.25 [A]). In a characteristic test to be described later, the SOC is set to 100% through the constant current charging and the constant voltage charging described above at an ambient temperature of 25 [° C.], and then the SOC is set based on a cell discharge capacity by using Expressions (1) and (2) through the constant current discharging described above.

Figure 2:
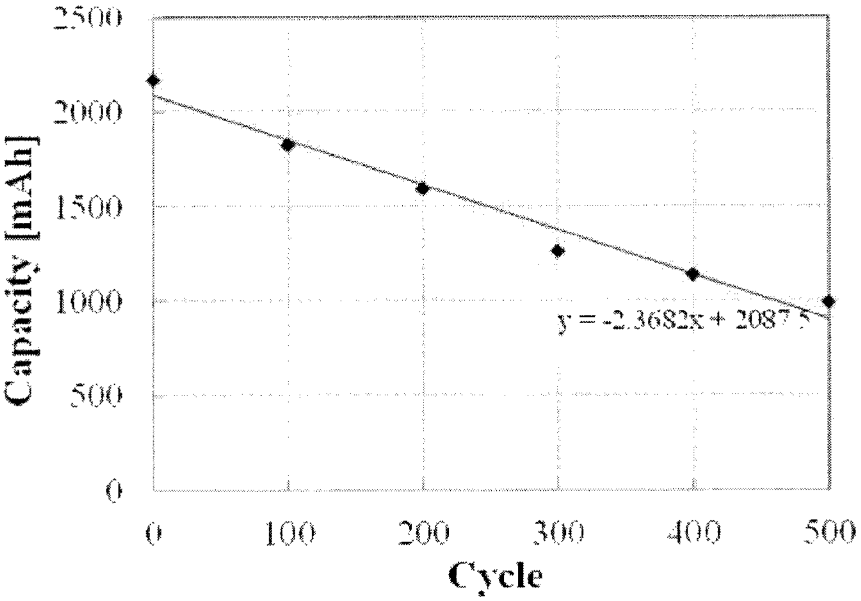
FIG. 2 is a cycle characteristic diagram of the cell discharge capacity of a lithium-ion secondary cell.

In the test, in order to examine electric characteristics of the cells, a new lithium-ion secondary cell (hereinafter, referred to as a new cell), and lithium-ion secondary cells (hereinafter, referred to as deteriorated cells) that are each charged and discharged for 100 cycles of charging and discharging between a new state (0 cycle) and 500 cycles are prepared. FIG. 2 illustrates a correlation between the cell discharge capacity and cell deterioration where the cell discharge capacity is defined to be a current integrated value when discharging at a constant current of 1 [C] (2.25 [A]) is performed as the SOC decreases from 100% to 0% in the new and the deteriorated cells. It is understood from FIG. 2 that the cell discharge capacity linearly decreases with cell deterioration. In other words, the cell nominal capacity $Q_{Br}$ of the lithium-ion secondary cell changes with cell deterioration. Thus, the SOC needs to be carefully set in the characteristic test of cell deterioration. Lithium-ion battery evaluation system As-510-LB4 manufactured by NF Corporation was used for current and voltage control in the lithium-ion secondary cell. Constant-temperature reservoir HIFLEX KEYLESS TL401 manufactured by ETAC Engineering Co., Ltd. was used to manage the ambient temperature of the lithium-ion secondary cell in the test.

Figure 3:
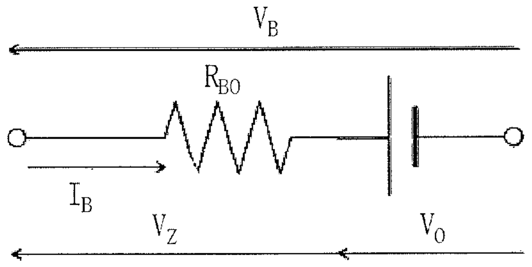
FIG. 3 is a diagram of an equivalent circuit of the lithium-ion secondary cell.
Figure 3:
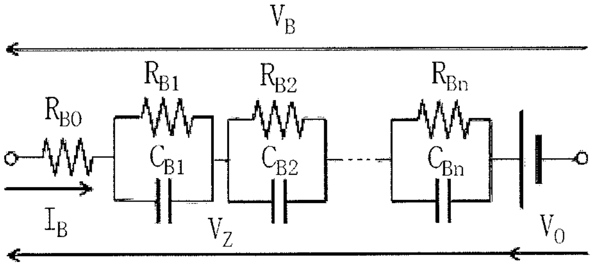

FIGS. 3(*a*) and 3(*b*) each illustrate an equivalent circuit of the lithium-ion secondary cell. The equivalent circuit illustrated in FIG. 3(*a*) is a simplest equivalent circuit in which an internal voltage $V_0$ and an internal resistance $R_{B0}$ are connected with each other in series. In an actual lithium-ion secondary cell (hereinafter, referred to as an actual cell), however, a potential drop $V_Z$ due to the internal impedance of the cell is not constant when charging and discharging is performed at a constant current. The actual cell has a transient characteristic that the cell inter-terminal voltage abruptly rises at start of charging and then gradually increases as time elapses, and the cell inter-terminal voltage abruptly falls at start of discharge and then gradually decreases as time elapses. For these reasons, it is preferable to express the transient characteristic due to the internal impedance and delay in a voltage waveform by using, as an equivalent circuit of the lithium-ion secondary cell, an equivalent circuit including CR parallel circuits connected with a series resistor $R_{B0}$ at multiple stages as illustrated in FIG. 3(*b*). When current at charging is taken to be positive, the potential drop $V_Z$ due to the cell internal impedance is given by Expression (3) using a cell inter-terminal voltage $V_B$ and a cell internal voltage $V_0$.

[Expression 3]

$$v_Z(t)=v_B(t)-v_0(t) \tag{3}$$

[Cell Deterioration Diagnostic Method]

The following describes the cell deterioration diagnostic method according to the present embodiment in detail. The cell deterioration diagnostic method according to the present embodiment diagnoses cell deterioration of the lithium-ion secondary cell based on an area (integrated value) S calculated by integrating a potential difference obtained by subtracting the cell internal voltage $V_0$ from the cell inter-terminal voltage $V_B$ as the cell inter-terminal voltage $V_B$ converges to the cell internal voltage $V_0$ that is determined by a charging rate (SOC) after completion of charging. This cell deterioration diagnostic method can diagnose cell deterioration mainly using numerical integration with the four basic arithmetic operations only, and thus is relatively inexpensive and practical.

Figure 4:
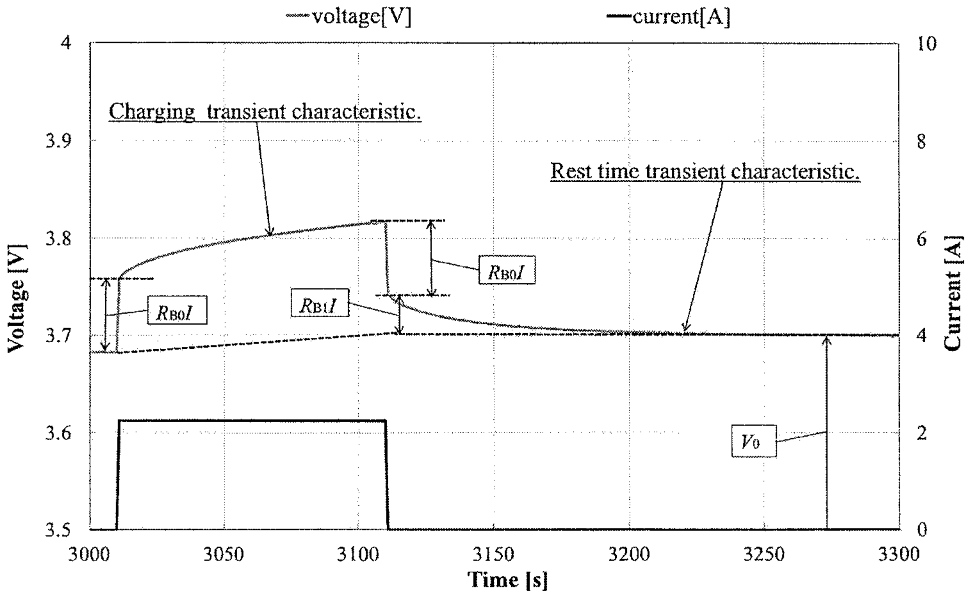
FIG. 4 is a diagram of voltage and current waveforms of the lithium-ion secondary cell when charged with a pulse current.

FIG. 4 illustrates current and voltage waveforms when the lithium-ion secondary cell is charged with a pulse current (square-wave current) having a time width of 100 seconds and an amplitude of 1 [C] (2.25 [A]). A transient response voltage waveform (cell inter-terminal voltage waveform) $V_B$ after completion of charging illustrated in FIG. 4 is given through Expression (4) by using the equivalent circuit illustrated in FIG. 3(*b*) with a single CR parallel circuit, in other words, an equivalent circuit in which the series resistor $R_{B0}$ and a single CR parallel circuit (CR parallel circuit composed of a resistor $R_{B1}$ and a capacitor $C_{B1}$) are connected with each other in series.

[Expression 4]

$$V_B=R_{B1}I\left\{\exp\left(-\frac{t}{\tau_1}\right)\right\}+V_0\ \left(\because \tau_1=C_{B1}R_{B1}\right) \tag{4}$$

Figure 5:
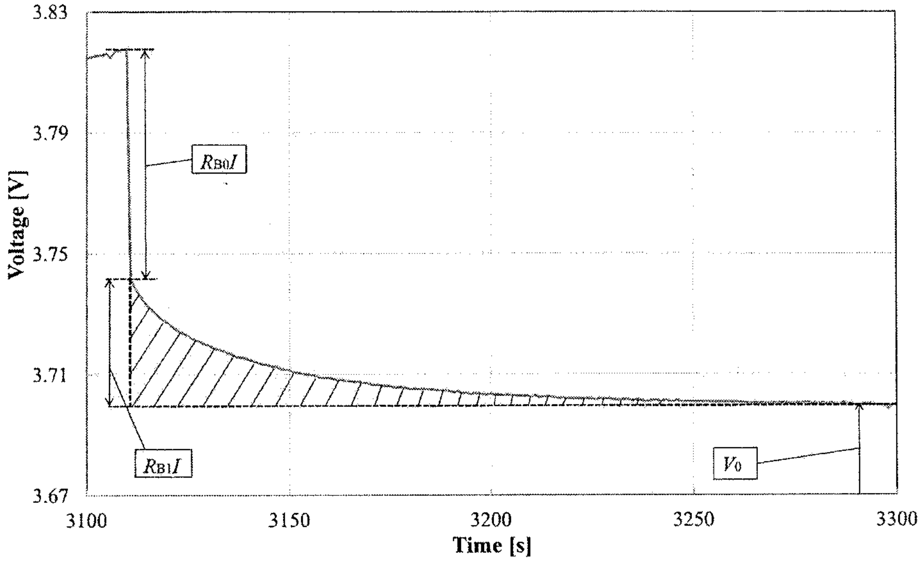
FIG. 5 is an enlarged view of the voltage waveform illustrated in FIG. 4 right after completion of charging.

As illustrated in FIG. 4, the cell internal voltage $V_0$ increases during charging and remains constant after completion of the charging. Thus, the cell terminal voltage waveform $V_B$ after completion of the charging, for which the charging rate (SOC) does not change and variation in the cell internal voltage $V_0$ does not need to be considered, is used for the cell deterioration diagnosis. Although the cell internal voltage $V_0$ is a function of the SOC, the transient response voltage waveform after completion of charging, for which the SOC does not change, can be regarded as a constant determined by the SOC after completion of charging. In other words, the cell internal voltage $V_0$ is large when the SOC after completion of charging is large, or is small when the SOC after completion of charging is small. FIG. 5 illustrates an enlarged view of the voltage waveform $V_B$ illustrated in FIG. 4 after completion of charging. A hatched part illustrated in FIG. 5 corresponds to the area S calculated by integrating the difference obtained by subtracting the cell internal voltage $V_0$ from the cell inter-terminal voltage $V_B$.

The series resistance $R_{B0}$ of the equivalent circuit, the resistance $R_{B1}$ of the CR parallel circuit, and a time constant $\tau_1$ as the product of the resistance $R_{B1}$ and the capacitance $C_{B1}$ of the CR parallel circuit increase with cell deterioration. However, the series resistance $R_{B0}$ is largely affected by contact resistance and thus not useful as a parameter for the cell deterioration diagnosis. The series resistance $R_{B0}$ can be separated from the equivalent circuit because the cell deterioration diagnostic method according to the present embodiment does not use the abrupt potential drop right after completion of charging due to the series resistance $R_{B0}$.

The potential difference obtained by subtracting the cell internal voltage $V_0$ from the cell inter-terminal voltage $V_B$ after completion of charging increases as the resistance $R_{B1}$ increases with cell deterioration. In addition, the gradient of the convergence of the cell inter-terminal voltage $V_B$ after completion of charging to the cell internal voltage $V_0$ decreases as the time constant which is the product of the resistance $R_{B1}$ and the capacitance $C_{B1}$, increases with cell deterioration. Accordingly, the area S (hatched part) calculated by integrating the difference obtained by subtracting the cell internal voltage $V_0$ from the cell inter-terminal voltage $V_B$ increases with cell deterioration. Thus, the cell deterioration can be diagnosed through comparison of the area S.

When Tmax represents a time when the cell inter-terminal voltage $V_B$ converges to the cell internal voltage $V_0$, the area S calculated by integrating the difference obtained by subtracting the cell internal voltage $V_0$ from the cell inter-terminal voltage $V_B$ is given by Expression (5).

[Expression 5]

$$S = \int_{t=0}^{T_{max}} \{V_0(t) - V_B(T_{max})\}dt = R_{B1} I\left\{\tau_1 - (T_{max} + \tau_1)\exp\left(-\frac{T_{max}}{\tau_1}\right)\right\} \because V_B(T_{max}) = R_{B1} I\left\{\exp\left(-\frac{T_{max}}{\tau_1}\right)\right\} + V_0 \tag{5}$$

When the time Tmax in Expression (5) is taken to be infinite, the area S is given by Expression (6).

[Expression 6]

$$S=\int_{t=0}^{\infty}\{V_B(t)-V_B(\infty)\}dt=\tau_1 R_{B1} I=C_{B1}R_{B1}^2 I=qR_{B1} \tag{6}$$

From Expression (6), the area S is expressed as the product of the resistance $R_{B1}$ and an electric charge amount q stored during charging and released after completion of the charging. The electric charge amount q is expressed as the product of the resistance $R_{B1}$, the capacitance $C_{B1}$, and a charging current I. Thus, the comparison of the area S along with cell deterioration is synonymous with comparison of change of the electric charge amount q and the resistance $R_{B1}$ along with cell deterioration.

[Accuracy Examination of Cell Deterioration Diagnostic Method]

The following first describes an examination with a theoretical waveform. The equivalent circuit with a single CR parallel circuit in which the series resistor $R_{B0}$ and the CR parallel circuit are connected with each other in series is used to calculate a theoretical waveform of the cell inter-terminal voltage $V_B$. The cell internal voltage $V_0$ remains constant as the cell inter-terminal voltage $V_B$ converges to the cell internal voltage $V_0$ after completion of charging, and thus is not taken into account. Thus, the theoretical waveform of the cell inter-terminal voltage $V_B$ can be expressed as a waveform obtained by removing the waveform of the cell internal voltage $V_0$ from the waveform of the cell inter-terminal voltage $V_B$. The equivalent circuit has circuit constants as follows: the series resistance $R_{B0}$ is 30 [mΩ], the capacitance $C_{B1}$ of the CR parallel circuit is 1[F], and the resistance $R_{B1}$ of the CR parallel circuit has a value at each step of 2 [mΩ] between 8 [mΩ] and 16 [mΩ]. The charging current is a pulse current of 1 [C] (2.25 [A]), and the charging time is 10 seconds so that the cell inter-terminal voltage $V_B$ is in a stationary state during charging. The transient response voltage waveform (cell inter-terminal voltage waveform) $V_B$ after completion of charging is observed under these conditions, and comparison is performed for the area S calculated by integrating the difference obtained by subtracting the cell internal voltage $V_0$ from the cell inter-terminal voltage $V_B$ as the cell inter-terminal voltage $V_B$ converges to the cell internal voltage $V_0$ after completion of charging. The area S is calculated by Expression (7) with a sampling frequency of 2 [kHz]. In the expression, Δt is a time step.

[Expression 7]

$$S = \sum_{n=0}^{m-1}\{V_B(n\Delta t) - V_B(m\Delta t)\}\Delta t \tag{7}$$

Figure 6:
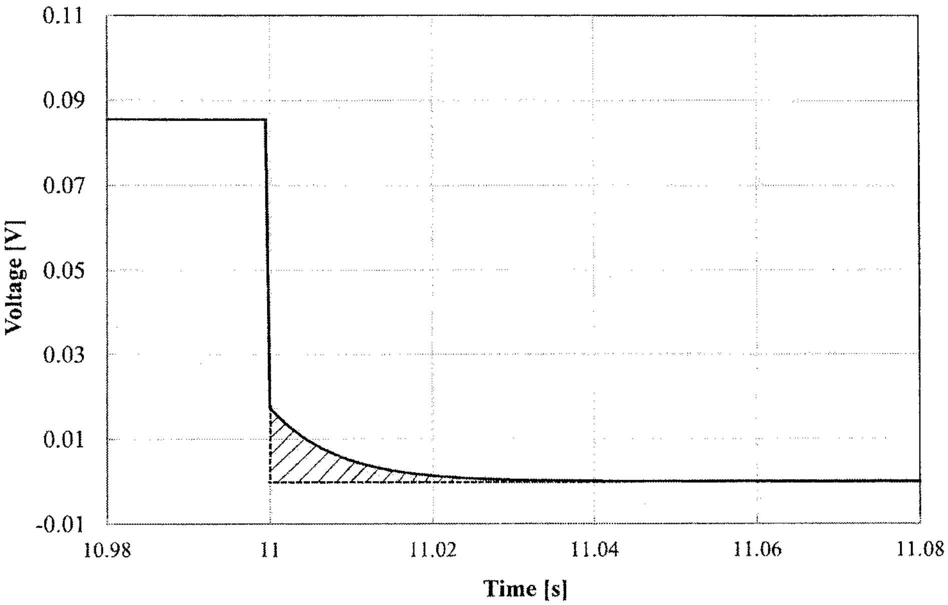
FIG. 6 is a diagram of a theoretical waveform of a cell inter-terminal voltage calculated from the equivalent circuit.
Figure 7:
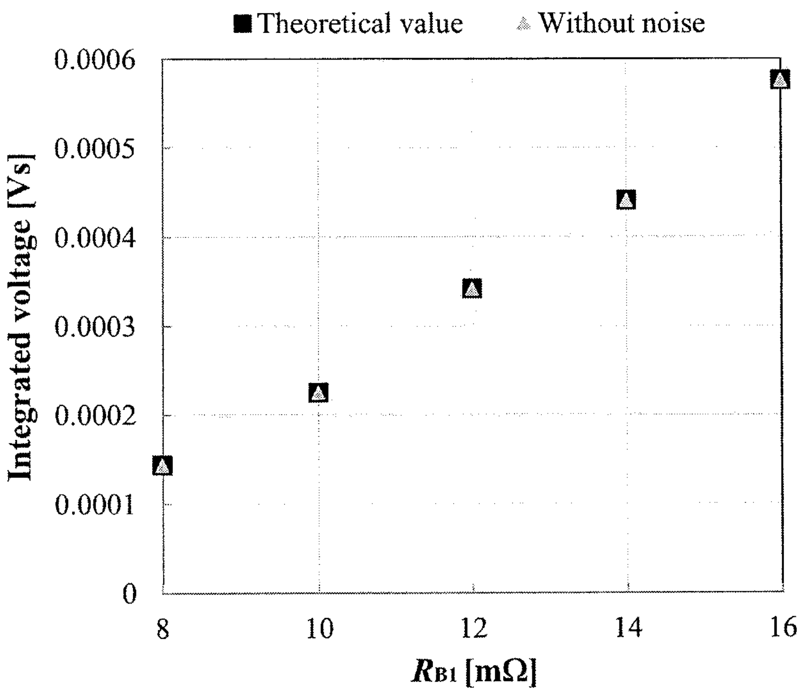
FIG. 7 is a resistance $R_{B1}$ characteristic diagram of an integrated voltage (area S).

FIG. 6 illustrates the theoretical waveform of the cell inter-terminal voltage $V_B$ after completion of charging when the resistance $R_{B1}$ is 8 [mΩ]. FIG. 7 illustrates a resistance $R_{B1}$ characteristic of a theoretical value of the area S calculated by Expression (5), and a resistance $R_{B1}$ characteristic of the area S ("Without noise") calculated based on the theoretical waveform by Expression (7). It is understood from FIG. 7 that the area S increases proportionally with the resistance $R_{B1}$ as the resistance $R_{B1}$ increases. It is also indicated that the theoretical value of the area S calculated by Expression (5) excellently matches with the area S calculated based on the theoretical waveform by Expression (7).

The following describes examination with noise. Conditions of the examination with noise are same as the conditions of the examination with the theoretical waveform described above. Superimposed noise is expressed with a random number of ±1 [mV] based on a measured waveform result when charging is performed with a pulse current of 1 [C] (2.25 [A]). The noise has an amplitude that is 13.2% of the voltage ($R_{B1}$I) after completion of charging.

Figure 8:
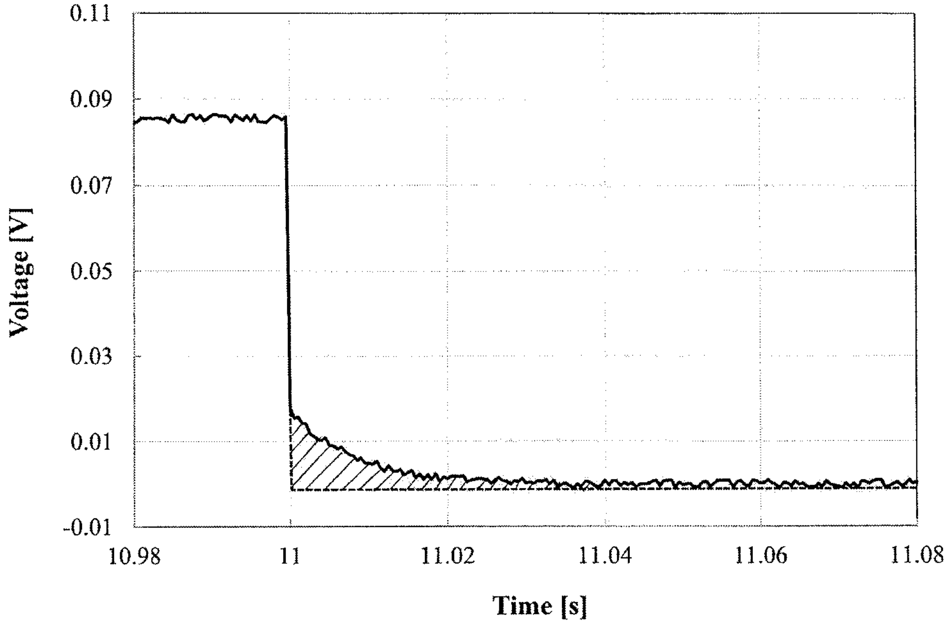
FIG. 8 is a diagram of a theoretical waveform of the cell inter-terminal voltage calculated from the equivalent circuit with influence of noise taken into account.
Figure 9:
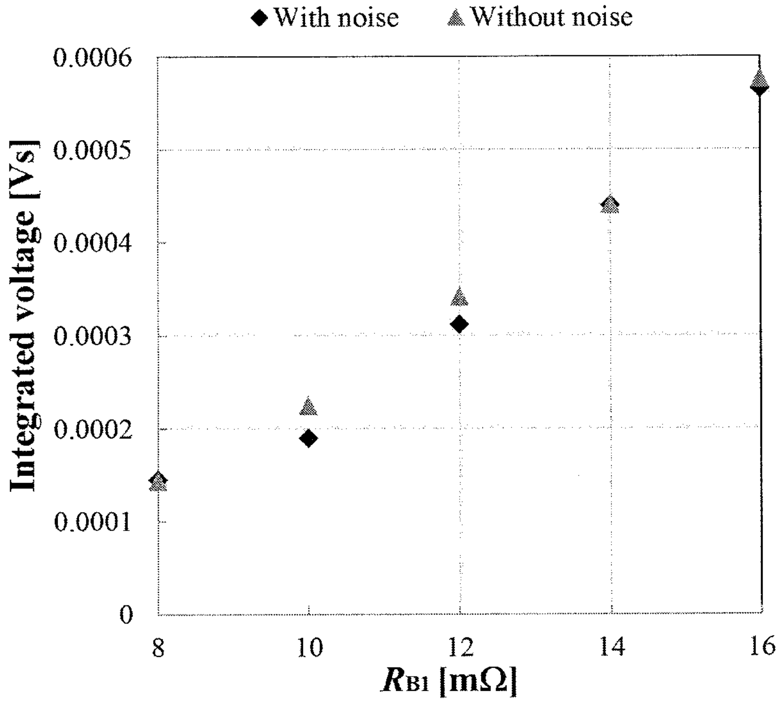
FIG. 9 is a resistance $R_{B1}$ characteristic diagram of the integrated voltage (area S) with influence of noise taken into account.

FIG. 8 illustrates the theoretical waveform of the cell inter-terminal voltage $V_B$ with taken into account influence of the noise after completion of charging when the resistance $R_{B1}$ is 8 [mΩ]. FIG. 9 illustrates resistance $R_{B1}$ characteristics of the area S with and without taken into account influence of the noise. It is understood from FIG. 9 that the area S substantially linearly increases as the resistance $R_{B1}$ increases in the case with influence of the noise taken into account. Accordingly, the cell deterioration diagnostic method according to the present embodiment is robust to noise and highly stable, and thus is useful as a method of diagnosing cell deterioration.

[Characteristic Test Using Cell Deterioration Diagnostic Method]

Since characteristics of an actual cell changes depending on use conditions such as the SOC and the temperature, usefulness of the cell deterioration diagnostic method according to the present embodiment is examined by performing characteristic tests. In addition, for example, a current pulse width, a sampling frequency, and a maximum observation time, which are necessary for the cell deterioration diagnostic method according to the present embodiment, are also examined. The numerical integration in each characteristic test is performed for $T_{max}$ seconds (for example, 30 seconds) after completion of charging. The cell inter-terminal voltage $V_B$ when $T_{max}$ seconds has elapsed after completion of charging is defined to be a cell internal voltage $V_{Tmax}$ and calculated by using Expression (7). In other words, $T_{max}$ does not necessarily need to be a time when the cell inter-terminal voltage $V_B$ converges to the cell internal voltage $V_0$, but may be a time halfway through the convergence of the cell inter-terminal voltage $V_B$ to the cell internal voltage $V_0$. Thus, the cell deterioration diagnostic method according to the present embodiment can diagnose cell deterioration based on the integrated value (area S) calculated by integrating the potential difference obtained by subtracting the cell internal voltage $V_{Tmax}$ from the cell inter-terminal voltage $V_B$ as the cell inter-terminal voltage $V_B$ converges to the cell internal voltage $V_{Tmax}$.

(Cell Deterioration Dependency)

Conditions of a test on cell deterioration dependency are as follows: the ambient temperature is 25 [° C.], the SOC at completion of charging is 50% in the new and the deteriorated cells, and the charging current is a pulse current having an amplitude 1 [C] (2.25 [A]). First, the characteristic test is performed with the sampling frequency being set to 1 [Hz] and 2 [kHz] to examine a time step enough to allow the cell deterioration diagnosis. The charging time in this case is 100 seconds.

Figure 10:
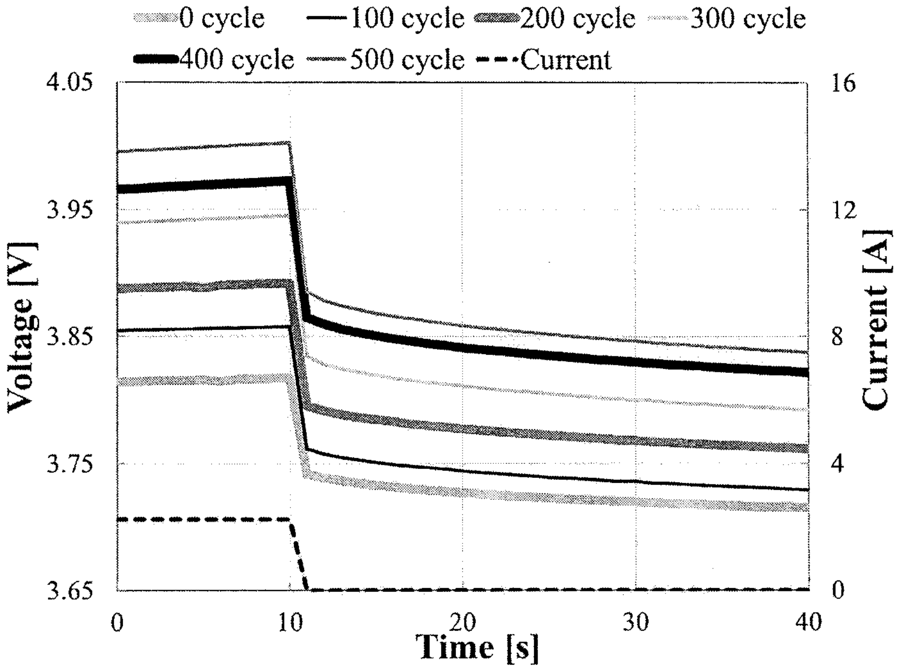
FIG. 10 is a diagram of voltage and current waveforms of a new cell and deteriorated cells, illustrating a case with a sampling frequency of 1 [Hz] in (a) and a case with a sampling frequency of 2 [kHz] in (b).
Figure 10:
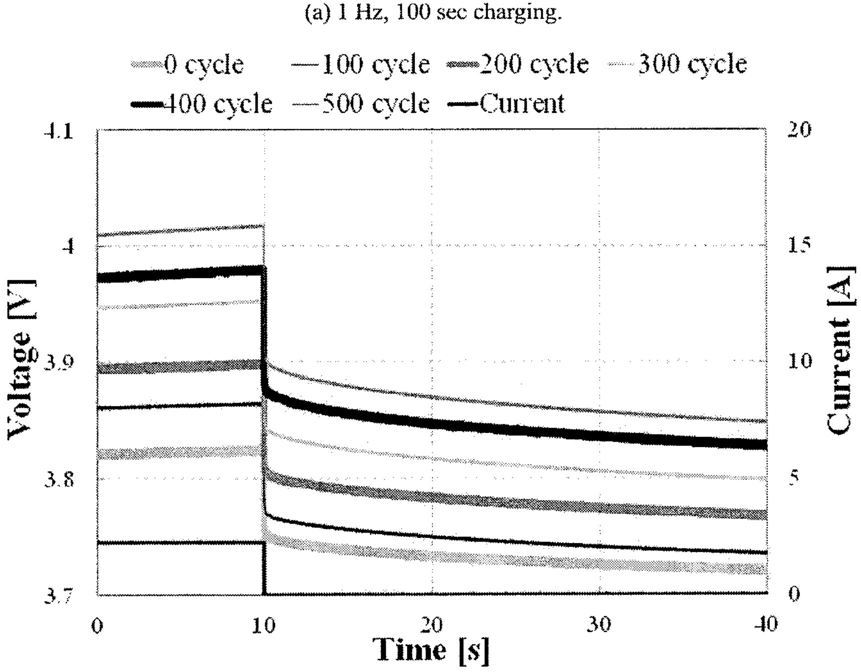
Figure 11:
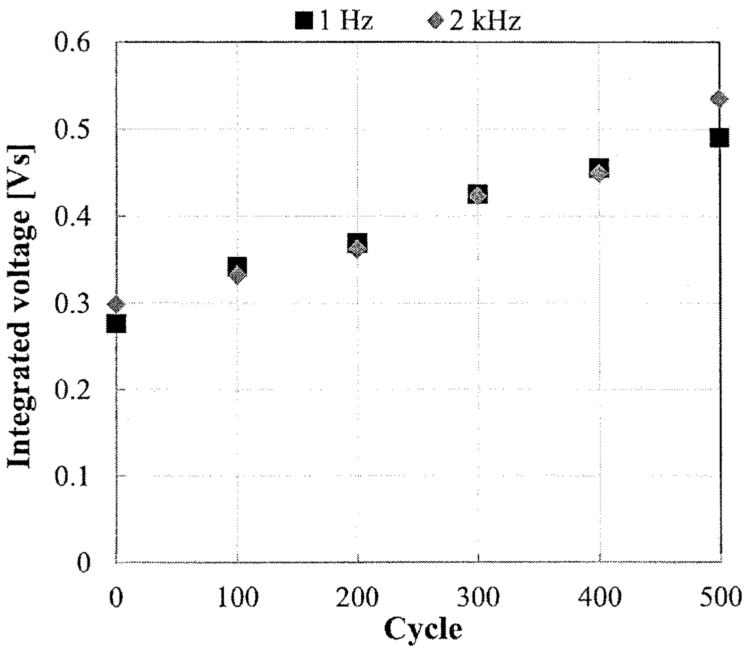
FIG. 11 is a cycle characteristic diagram of integrated voltages (areas S) of the new and deteriorated cells in cases with sampling frequencies of 1 [Hz] and 2 [kHz].

FIGS. 10(*a*) and 10(*b*) illustrate the cell inter-terminal voltage $V_B$ before and after completion of charging in the new and the deteriorated cells when the sampling frequency is 1 [Hz] and 2 [kHz], respectively. FIG. 11 illustrates cell deterioration characteristics of the area S when the sampling frequency is 1 [Hz] and 2 [kHz]. It is understood from FIG. 11 that the area S differs by 9.15% at maximum in the 500-cycle deteriorated cell as the sampling frequency is decreased from 2 [kHz] to 1 [Hz], and thus the cell deterioration diagnosis can be performed with the sampling frequency of 1 [Hz].

Figure 12:
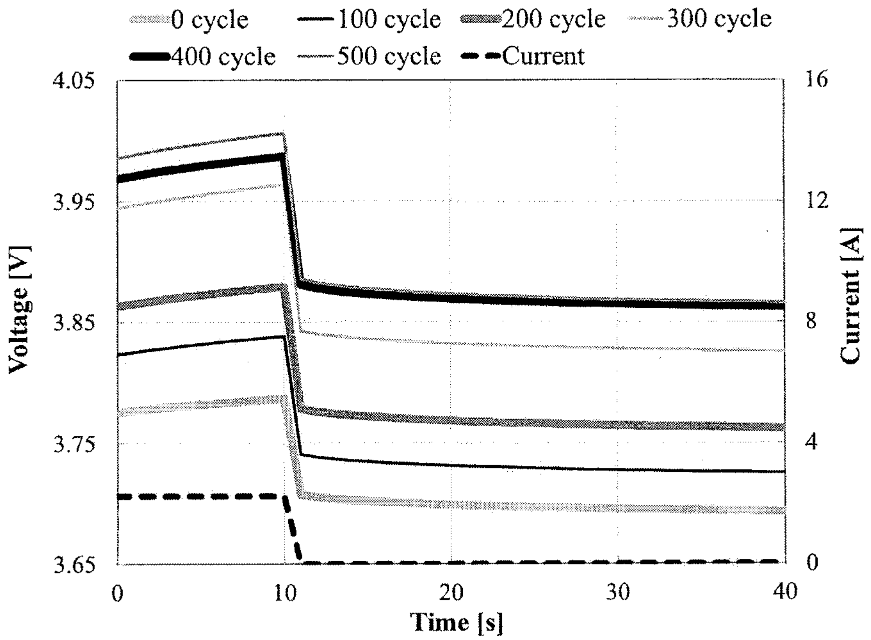
FIG. 12 is a diagram of voltage and the current waveforms of the new and deteriorated cells in a case with a charging time of 15 seconds and a sampling frequency of 1 [Hz].
Figure 13:
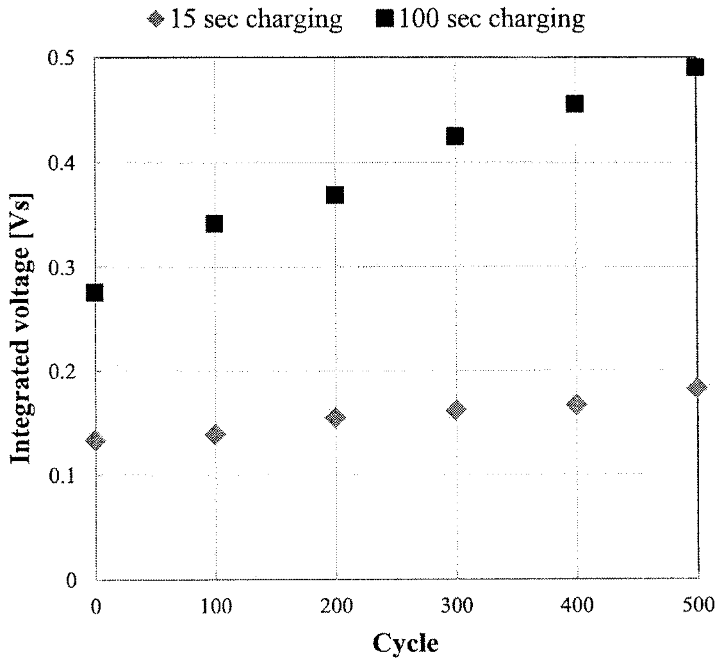
FIG. 13 is a cycle characteristic diagram of the integrated voltages (areas S) of the new and deteriorated cells in cases with charging times of 15 seconds and 100 seconds.

Charging time dependency and cell deterioration dependency of the area S are examined with charging times of 15 seconds and 100 seconds. FIG. 12 illustrates the cell inter-terminal voltage $V_B$ in the new and the deteriorated cells before and after completion of charging when the charging time is 15 seconds and the sampling frequency is 1 [Hz]. FIG. 13 illustrates the cell deterioration dependency of the area S in the new and the deteriorated cells when the charging time is 15 seconds and 100 seconds and the sampling frequency is 1 [Hz]. It is understood from FIG. 13 that the area S increases proportionally with cell deterioration. Comparison of the area S between the new cell and the 500-cycle cell indicates that the area is larger for the 500-cycle cell by 37.1% when charging is performed for 15 seconds and the area is larger for the 500-cycle cell by 77.4% when charging is performed for 100 seconds. Accordingly, it is understood from FIG. 13 that the cell deterioration diagnosis can be performed even in the case with the charging time of 15 seconds, but change of the area S due to cell deterioration becomes significant as the charging time increases. This indicates that the cell deterioration diagnosis has a higher accuracy in the case with the charging time of 100 seconds.

(SOC Dependency)

Conditions of a characteristic test on SOC dependency are as follows: the ambient temperature is 25 [° C.], the SOC at completion of charging is 20% to 80% in the new and the deteriorated cells, the charging current is a pulse current having an amplitude 1 [C] (2.25 [A]), and the sampling frequency is 1 [Hz].

Figure 14:
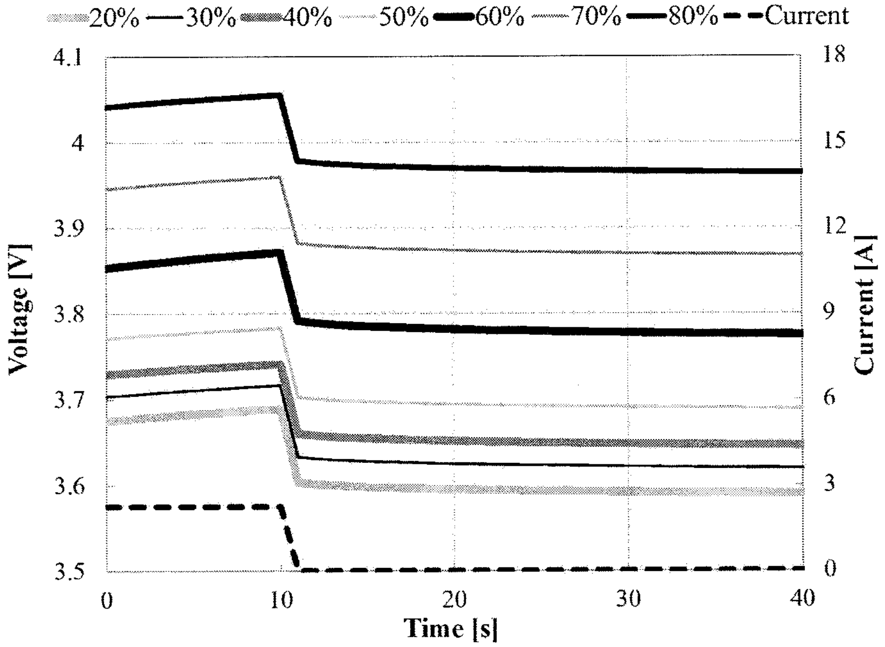
FIG. 14 is a diagram of the voltage and current waveforms of the new cell having different SOCs at completion of charging, illustrating a case with a charging time of 15 seconds in (a) and a case with a charging time of 100 seconds in (b).
Figure 14:
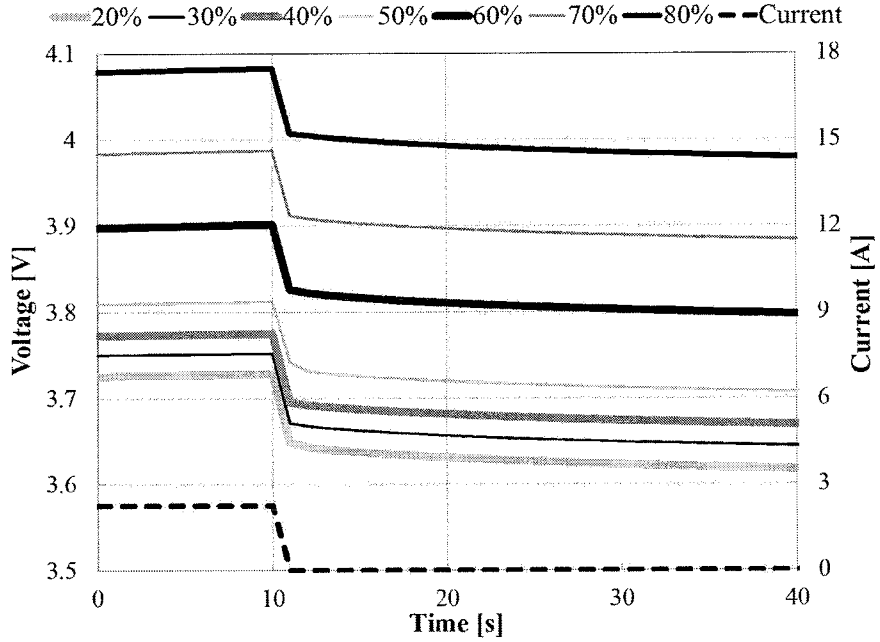
Figure 15:
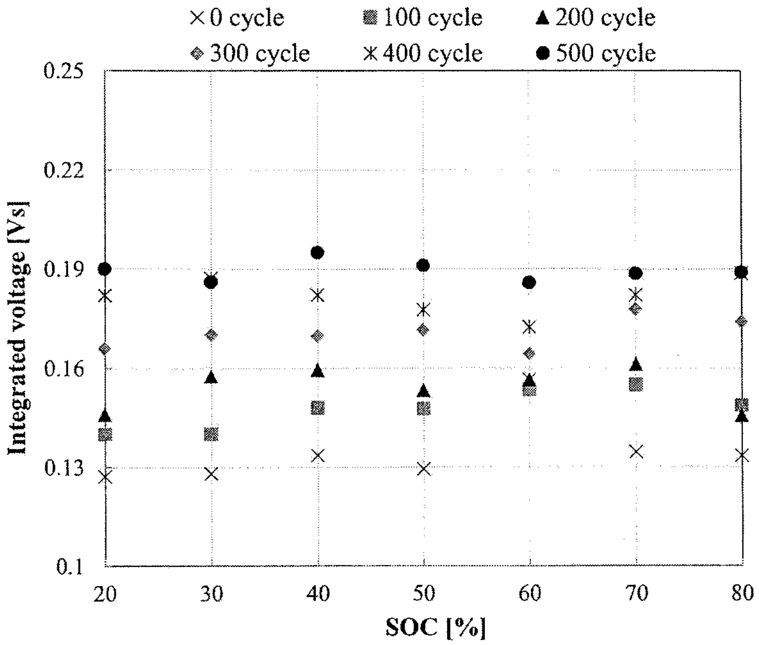
FIG. 15 is an SOC characteristic diagram of the integrated voltages (areas S) of the new and deteriorated cells, illustrating a case with a charging time of 15 seconds in (a) and a case with a charging time of 100 seconds in (b).
Figure 15:
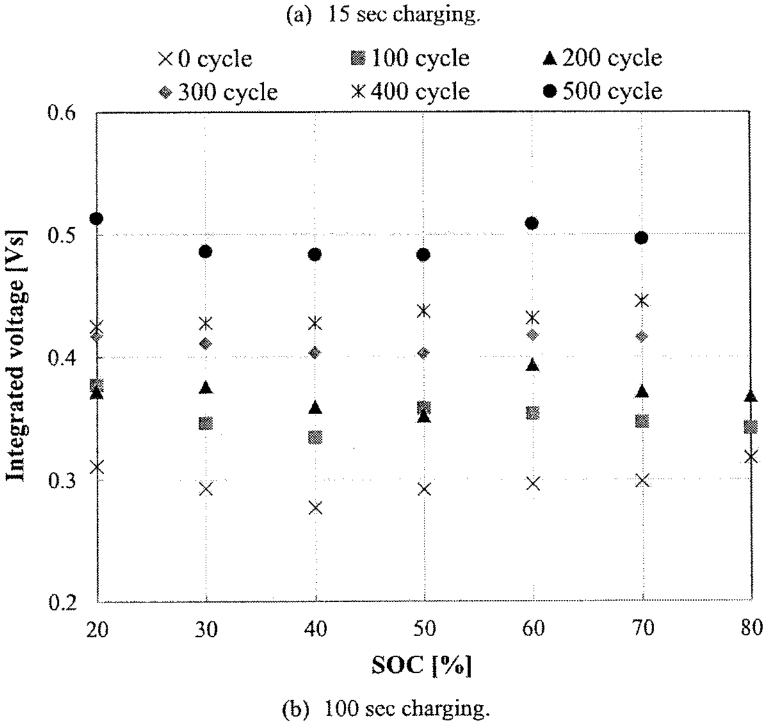

FIG. 14 illustrates the cell inter-terminal voltage $V_B$ in the new cell before and after completion of charging when the charging time is 15 seconds and 100 seconds and the SOC at completion of charging has a value at each step of 10% between 20% to 80%. FIG. 15 illustrates a SOC characteristic of the area S when the new and the deteriorated cells are charged for 15 seconds and 100 seconds. As illustrated in FIG. 15(*a*), in the new cell with the charging time of 15 seconds, a maximum difference in the area S due to the SOC is observed where the area S when the SOC is 60% is larger than the area S when the SOC is 20% by 23.0%. A minimum difference in the calculated area S between the new cell and the 500-cycle deteriorated cell is observed where the area S of the 500-cycle deteriorated cell is larger than that of the new cell by 18.7% when the SOC is 60%.

As illustrated in FIG. 15(*b*), in the new cell with the charging time of 100 seconds, a maximum difference in the area S due to the SOC is observed where the area S when the SOC is 80% is larger than the area when the SOC is 40% by 14.7%. A minimum difference in the calculated area S between the new cell and the 500-cycle deteriorated cell is observed where the area of the 500-cycle deteriorated cell when the SOC is 50% is larger than that of the new cell by 65.4%.

FIGS. 15(*a*) and 15(*b*) indicate that the influence of the SOC on the area S is smaller for a longer charging time, and change of the area S along with cell deterioration is larger for a longer charging time. However, the SOC dependency of the area S is small when the charging time is long. Thus, the cell deterioration diagnostic method according to the present embodiment can diagnose cell deterioration irrespective of the SOC (without estimating the SOC). However, when the cell deterioration diagnosis is performed by using an area (integrated value) S' calculated by integrating the cell inter-terminal voltage $V_B$ as the cell inter-terminal voltage $V_B$ converges to the cell internal voltage $V_0$ after completion of charging, the SOC dependency of the area S' is extremely large since the cell internal voltage $V_0$ is substantially proportional to the SOC after completion of charging. Thus, when the cell deterioration diagnosis is performed by using the area S', cell deterioration cannot be diagnosed without estimating the SOC of the lithium-ion secondary cell.

(Temperature Dependency)

Conditions of a test on temperature dependency are as follows: the ambient temperature has a value at each step of 10 [° C.] between −10 [° C.] and +40 [° C.], the SOC at completion of charging is 50% in the new and the deteriorated cells, and the charging current is a pulse current having an amplitude 1 [C] (2.25 [A]). In addition, the sampling frequency is 1 [Hz], and the charging time is 15 seconds and 100 seconds.

Figure 16:
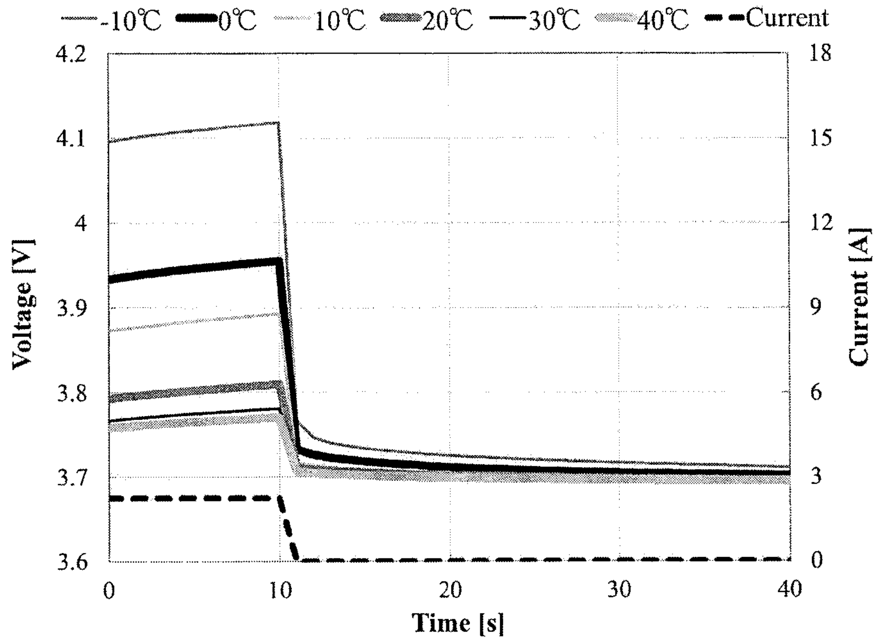
FIG. 16 is a diagram of the voltage and current waveforms of the new cell at different ambient temperatures, illustrating a case with a charging time of 15 seconds in (a) and a case with a charging time of 100 seconds in (b).
Figure 16:
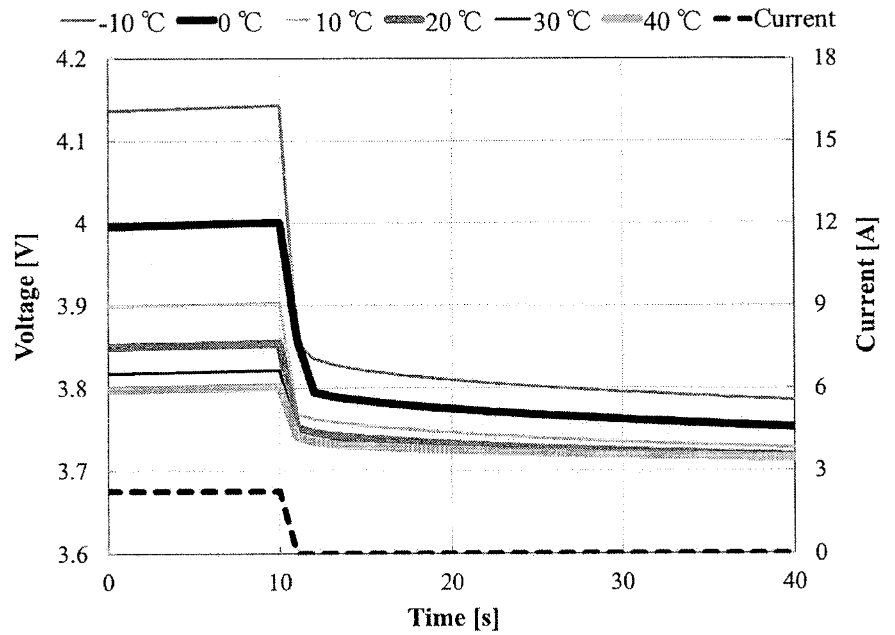
Figure 17:
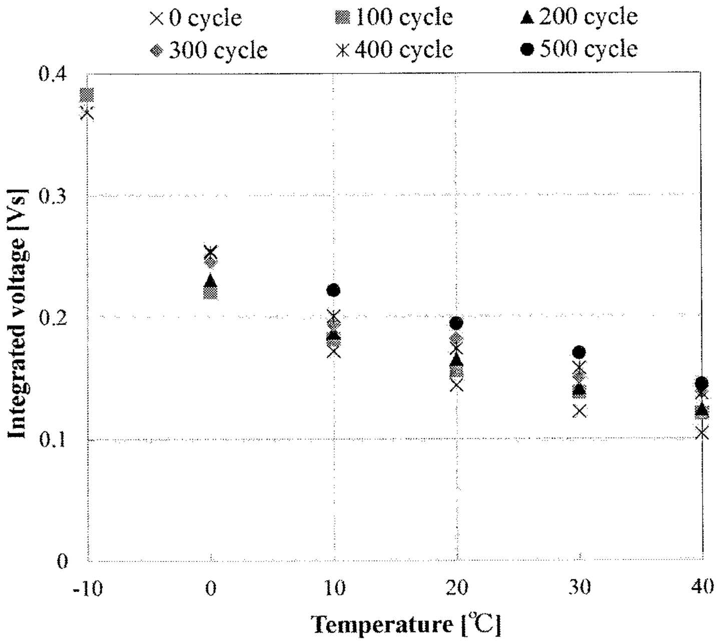
FIG. 17 is a temperature characteristic diagram of the integrated voltages (areas S) of the new and deteriorated cells, illustrating a case with a charging time of 15 seconds in (a) and a case with a charging time of 100 seconds in (b).
Figure 17:
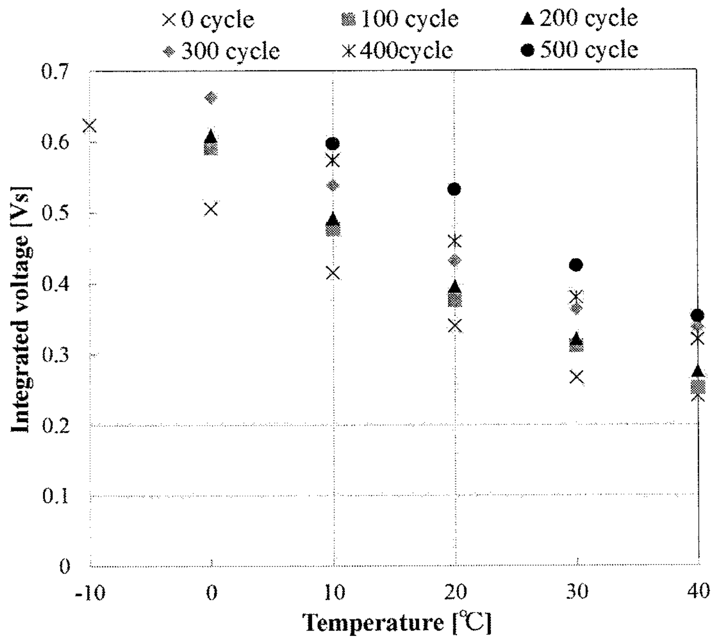

FIG. 16 illustrates the cell inter-terminal voltage $V_B$ before and after completion of charging when the new cell at different ambient temperatures is charged for 15 seconds and 100 seconds. FIG. 17 illustrates a temperature characteristic of the area S when the new and the deteriorated cells are charged for 15 seconds and 100 seconds. It is understood from FIG. 17 that the area S is exponentially smaller at a higher temperature when the charging time is 15 seconds and 100 seconds. Accordingly, when the temperature at charging is not constant, it is difficult to determine cell deterioration by the cell deterioration diagnostic method according to the present embodiment. Thus, it is preferable to perform temperature correction. It is understood from FIG. 17 that the change of the area S along with cell deterioration is larger with a longer charging time. Accordingly, it is preferable to have the charging time of 100 seconds or longer with which sufficient cell deterioration characteristics are observed.

(Temperature Correction)

The temperature correction is examined when the charging time is set to 100 seconds. As illustrated in FIG. 17, since the area S exponentially decreases as the temperature increases, fitted curves are calculated from measured data illustrated in FIG. 17(*b*) by a least-squares method. The area S can be expressed with the exponential function in Expression (8) using an ambient temperature T.

[Expression 8]

$$S = A\exp\left(\frac{T}{T_t}\right) \quad (8)$$

Figure 18:
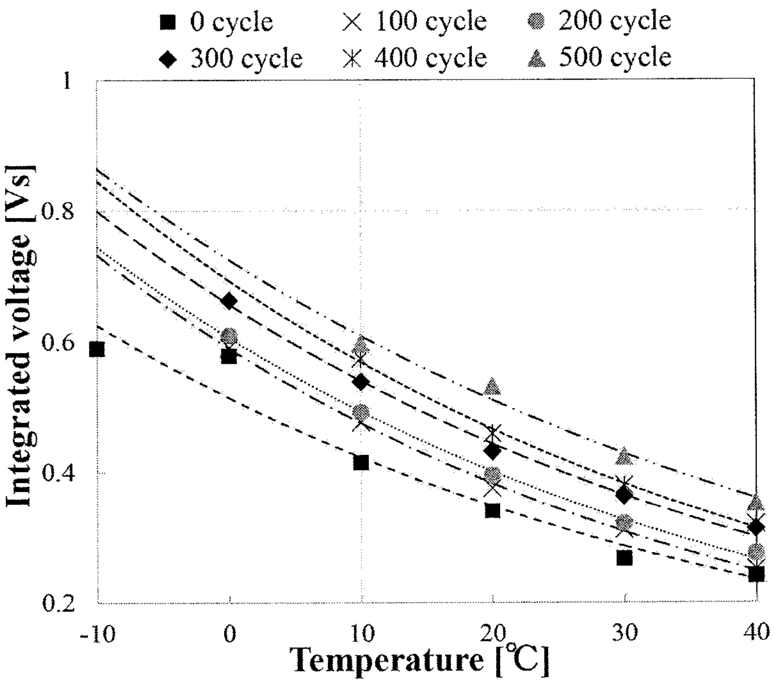
FIG. 18 is a diagram in which fitted curves obtained by a least-squares method are added to the diagram illustrated in FIG. 17(*b*).

FIG. 18 illustrates the fitted curves obtained by the least-squares method in addition to temperature characteristic data of the area S illustrated in FIG. 17(*b*). Table 2 lists cell deterioration characteristics of the coefficients A and $1/T_t$ in the fitted curve of Expression (8).

TABLE 2

| Cycle | A | $1/T_t$ |
|---|---|---|
| 0 | 0.514 | 0.0195 |
| 100 | 0.590 | 0.0216 |
| 200 | 0.606 | 0.0206 |
| 300 | 0.657 | 0.0196 |
| 400 | 0.693 | 0.0198 |
| 500 | 0.725 | 0.0175 |

As listed in Table 2, the coefficient A increases with cell deterioration. The coefficient $1/T_t$ does not depend on cell deterioration, but has a maximum difference of 0.0041 [1/° C.] between 100 cycles and 500 cycles. The exponential $\exp(-T/T_t)$ in Expression (8) does not depend on cell deterioration and can be regarded as a constant. The coefficient $1/T_t$ is set to 0.0198, which is an average value over the new and the deteriorated cells listed in Table 2, and substituted into Expression (8) to obtain Expression (9) that is a correction formula of the area S with temperature taken into account. In other words, the coefficient A is an area after temperature correction.

[Expression 9]

$$A=S\ \exp(0.0198\ T) \quad (9)$$

Figure 19:
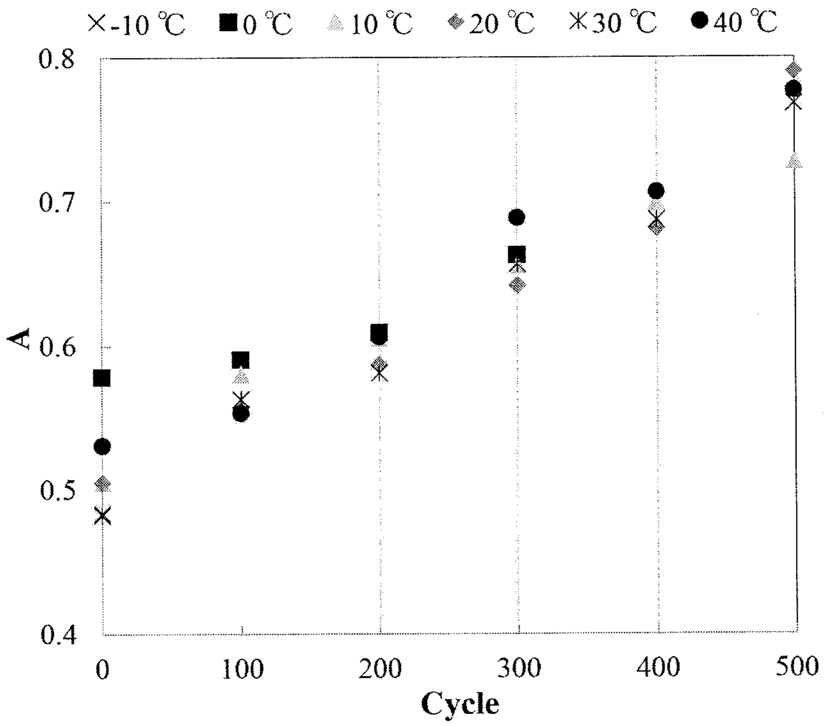
FIG. 19 is a cycle characteristic diagram of a coefficient A calculated from FIG. 18.

FIG. 19 illustrates cell deterioration characteristics of the coefficient A obtained by substituting values of the area S illustrated in FIG. 17(*b*) into Expression (9). It is understood from FIG. 19 that the coefficient A increases with cell deterioration. Thus, the cell deterioration diagnosis of the lithium-ion secondary cell can be performed by calculating the coefficient A in Expression (9).

The area S slightly changes with the SOC. In order to achieve derivation of a highly accurate temperature correction formula, it is preferable to use an average value of the area S with each SOC at different ambient temperatures.

Figure 20:
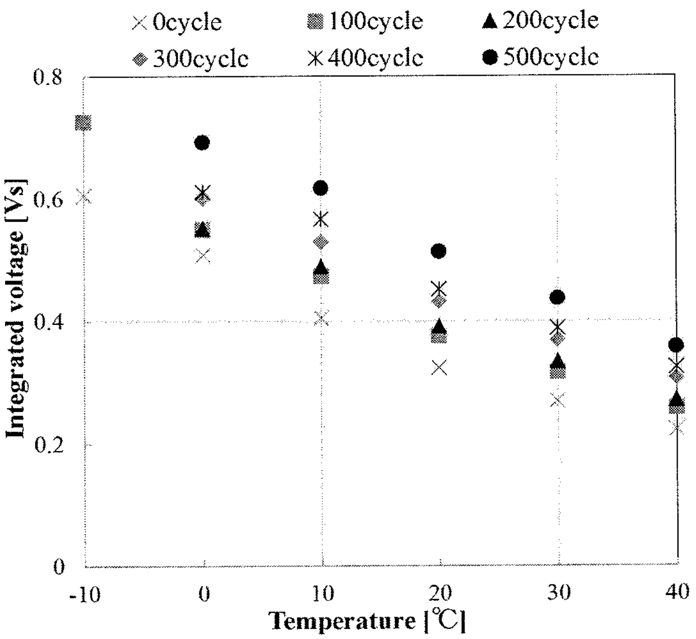
FIG. 20 is a temperature characteristic diagram of average values of the integrated voltages (average values of areas S) of the new and deteriorated cells.

Conditions of a test on the derivation of a highly accurate temperature correction formula are as follows: the ambient temperature has a value at each step of 10 [° C.] between −10 [° C.] and +40 [° C.], the SOC at completion of charging has a value at each step of 10% between 20% to 80% in the new and the deteriorated cells, the charging current is a pulse current having an amplitude of 1 [C] (2.25 [A]) and a charging time of 100 seconds, and the sampling frequency is 1 [Hz]. FIG. 20 illustrates the average value of the area S calculated at each SOC.

Figure 21:
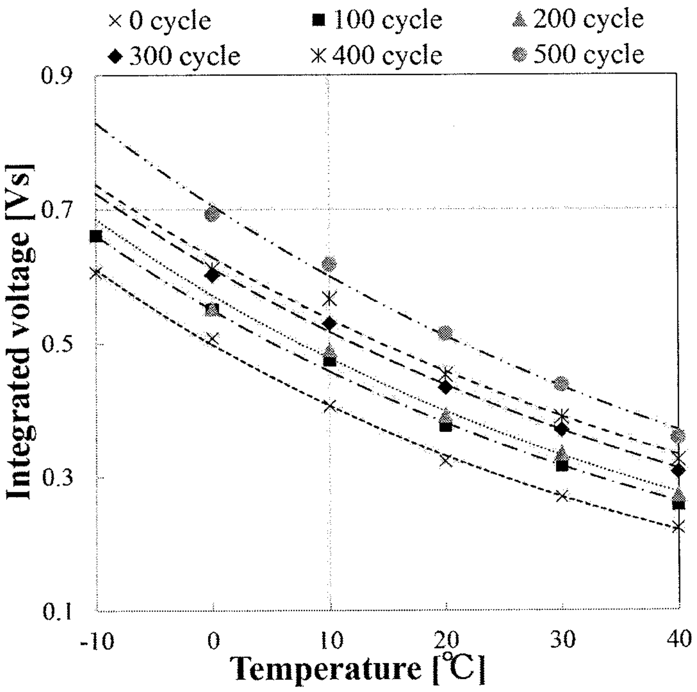
FIG. 21 is a diagram in which fitted curves obtained by the least-squares method are added to the diagram illustrated in FIG. 20.

Similarly to the derivation of the temperature correction formula when the SOC at completion of charging is 50% (refer to FIG. 18), fitted curves are calculated from FIG. 20 by the least-squares method. FIG. 21 illustrates the fitted curves obtained by the least-squares method in addition to the temperature characteristic data of the area S illustrated in FIG. 20. Table 3 lists cell deterioration characteristics of the coefficients A and $1/T_t$ of the fitted curve in Expression (8).

TABLE 3

| Cycle | A | $1/T_t$ |
|---|---|---|
| 0 | 0.498 | 0.0204 |
| 100 | 0.550 | 0.0184 |
| 200 | 0.572 | 0.0181 |
| 300 | 0.610 | 0.0168 |
| 400 | 0.629 | 0.0159 |
| 500 | 0.706 | 0.0161 |

As listed in Table 3, the coefficient (area after temperature correction) A increases with cell deterioration. The coefficient $1/T_t$ has no observed dependency on cell deterioration, but has a difference maximum of 0.0045 [1/° C.] between the new cell and the 400-cycle deteriorated cell. The coefficient $1/T_t$ is set to 0.0176, which is an average value over the deteriorated cells listed in Table 3, and substituted into Expression (8) to obtain Expression (10) that is a highly accurate temperature correction formula.

[Expression 10]

$$A=S\ \exp(0.0176\ T) \quad (10)$$

Figure 22:
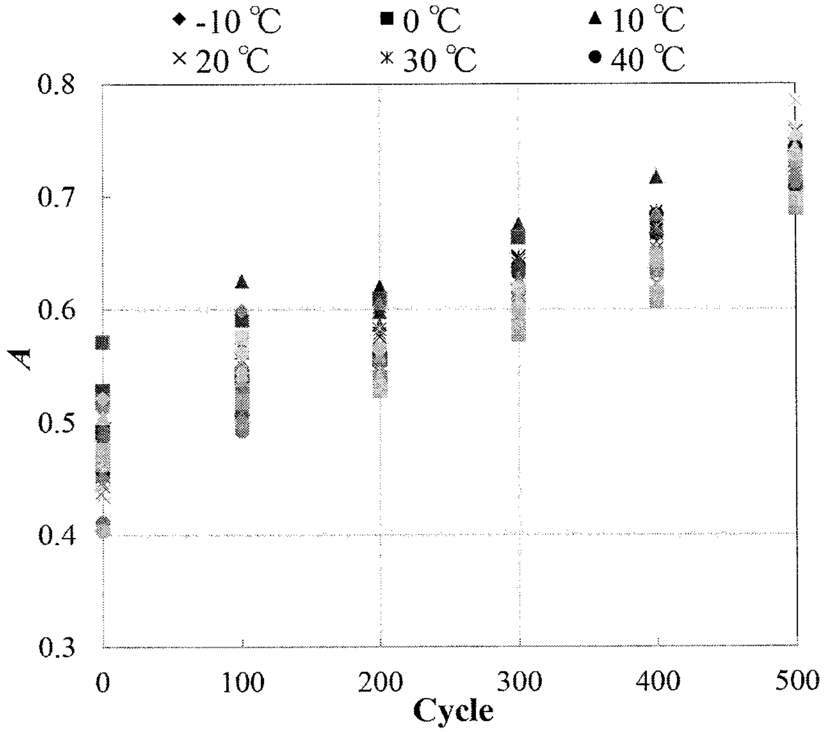
FIG. 22 is a cycle characteristic diagram of the coefficient A calculated from FIG. 21.

FIG. 22 illustrates cell deterioration characteristics of the coefficient A calculated by the temperature correction formula of Expression (10). In FIG. 22, difference in the color of each plot represents change in the SOC. It is understood from FIG. 22 that the coefficient A increases with cell deterioration. Thus, the cell deterioration diagnosis of the lithium-ion secondary cell can be performed by calculating the coefficient A in Expression (10).

[Cell Deterioration Diagnostic Device]

The cell deterioration diagnostic device 1 illustrated in FIG. 1 is a device for performing the cell deterioration diagnostic method according to the present embodiment, and includes the calculation unit 11, the storage unit 12, and the diagnosis unit 13. In FIG. 1, the cell deterioration diagnostic device 1 is provided separately from the charging circuit 2 configured to charge the lithium-ion secondary cell, but may be included in the charging circuit 2 or a protection device (not illustrated) of the charging circuit 2. The cell deterioration diagnostic device 1 receives inputting of a signal related to the cell inter-terminal voltage $V_B$ of the lithium-ion secondary cell measured by a voltage measuring mean 3, and a signal related to the ambient temperature (external air temperature) of the lithium-ion secondary cell measured by an ambient temperature measuring mean 4. In FIG. 1, the voltage measuring mean 3 and the ambient temperature measuring mean 4 are not included in the cell deterioration diagnostic device 1, but may be included in the cell deterioration diagnostic device 1.

The calculation unit 11 calculates the integrated value (area S) of the potential difference obtained by subtracting the cell internal voltage $V_0$ (the cell internal voltage $V_{Tmax}$)

from the cell inter-terminal voltage $V_B$ by integrating the potential difference as the cell inter-terminal voltage $V_B$ of the lithium-ion secondary cell converges to the cell internal voltage $V_0$ (the cell internal voltage $V_{Tmax}$) after completion of charging (after the charging step ends) of the lithium-ion secondary cell. For example, the calculation unit 11 can calculate the integrated value (area S) according to Expression (7). In this case, Δt is a sampling interval of the voltage measuring mean 3, n is the number of times of sampling by the voltage measuring mean 3, and m is the total number of times of sampling until the cell inter-terminal voltage $V_B$ converges to the cell internal voltage $V_0$ (the cell internal voltage $V_{Tmax}$). The cell inter-terminal voltage $V_B$ when n=0 is calculated to be $V_B=R_{B1}I+V_0$ by using the equivalent circuit (refer to FIG. 5), but may be measured by the voltage measuring mean 3 right after completion of the charging (right after an abrupt potential drop due to the series resistance $R_{B0}$). The calculation unit 11 calculates an integrated value after temperature correction (area A after temperature correction) based on a result of the measurement of the ambient temperature by the ambient temperature measuring mean 4.

The storage unit 12 stores first data (for example, a profile illustrated in FIG. 11) representing a relation between the integrated value (area S) and the number of charging and discharging cycles of the lithium-ion secondary cell, a correction function, such as $\exp(T/T_t)$ in Expressions (9) and (10), that exponentially increases as the ambient temperature of the lithium-ion secondary cell increases, and second data (for example, a profile illustrated in FIG. 22) representing a relation between the integrated value (area A after temperature correction) corrected by the correction function and the number of charging and discharging cycles of the lithium-ion secondary cell.

When the storage unit 12 stores the correction function and the second data, the calculation unit 11 corrects the integrated value (area S) by using the result of the measurement of the ambient temperature by the ambient temperature measuring mean 4 and the correction function. Then, the diagnosis unit 13 diagnoses cell deterioration of the lithium-ion secondary cell based on the corrected integrated value (area A after temperature correction) and the second data. When the storage unit 12 does not store the correction function and the second data, the diagnosis unit 13 diagnoses cell deterioration of the lithium-ion secondary cell based on the integrated value (area S) calculated by the calculation unit 11 and the first data.

Accordingly, the cell deterioration diagnostic method and the cell deterioration diagnostic device 1 according to the present embodiment are highly useful because the method and the device eliminate the need to remove the lithium-ion secondary cell from an instrument using the cell, require a small calculation load, and allow the cell deterioration diagnosis while the cell is operational. Thus, the cell deterioration diagnostic device 1 according to the present embodiment is highly useful as a consumer product and expected to contribute to safe operation when mounted on a protection device such as a battery management system (BMS). When the cell deterioration diagnosis is performed by using the area (integrated value) S' calculated by integrating the cell inter-terminal voltage $V_B$ as the cell inter-terminal voltage $V_B$ converges to the cell internal voltage $V_0$ (cell internal voltage $V_{Tmax}$) after completion of charging, influence on the area S' by the SOC is extremely large since the cell internal voltage $V_0$ is substantially proportional to the SOC after completion of charging. Thus, when the cell deterioration diagnosis is performed by using the area S', cell deterioration cannot be diagnosed without estimating the SOC of the lithium-ion secondary cell. However, in the present embodiment, in which the cell deterioration diagnosis is performed by using the area (integrated value) S calculated by integrating the potential difference obtained by subtracting the cell internal voltage $V_0$ (the cell internal voltage $V_{Tmax}$) from the cell inter-terminal voltage $V_B$, the SOC dependency of the area S is small, and thus cell deterioration can be diagnosed irrespective of the SOC of the lithium-ion secondary cell (without estimating the SOC).

The embodiments of the cell deterioration diagnostic method and the cell deterioration diagnostic device according to the present invention are described above. However, the present invention is not limited to the embodiments.

For example, the embodiments describe the lithium-ion secondary cell as an exemplary secondary cell, but the cell deterioration diagnostic method and the cell deterioration diagnostic device according to the present invention are applicable to any secondary cell other than the lithium-ion secondary cell.

In the embodiments, the pulse current is used at the charging step. However, any optional current can be used as long as the value of the current instantaneously becomes zero at completion of charging.

DESCRIPTION OF REFERENCE SIGNS

1 cell deterioration diagnostic device
2 charging circuit
3 voltage detecting mean
4 ambient temperature measuring mean
11 calculation unit
12 storage unit
13 diagnosis unit

The invention claimed is:

1. A cell deterioration diagnostic method of diagnosing cell deterioration of a rechargeable secondary cell having a cell internal voltage, a cell internal impedance, and a cell inter-terminal voltage, the method comprising:

charging the secondary cell by operation of a charging circuit that supplies a charging electrical current to the secondary cell, the charging causing the cell inter-terminal voltage to increase above the cell internal voltage over time in accordance with a charging transient characteristic;

discharging the secondary cell by interrupting the operation of the charging circuit to cause the cell inter-terminal voltage to decrease towards the cell internal voltage over time in accordance with a rest time transient characteristic;

measuring the cell inter-terminal voltage at predetermined sampling frequencies over the rest time transient characteristic with a voltage detector connected across the secondary cell;

storing potential differences between the cell inter-terminal voltage and the cell internal voltage at the sampling frequencies over the rest time transient characteristic in a storage unit;

integrating the stored potential differences to obtain an integration value by operation of a calculating unit; and diagnosing the cell deterioration of the secondary cell based on the integrated value by operation of a diagnosis unit.

2. The cell deterioration diagnostic method according to claim 1, and correcting the integrated value to a corrected integrated value by operation of the calculating unit by using a correction function that exponentially increases as an ambient temperature of the secondary cell increases, and wherein the diagnosing by the diagnosis unit is performed based on the corrected integrated value.

3. A cell deterioration diagnostic device configured to diagnose cell deterioration of a rechargeable secondary cell having a cell internal voltage, a cell internal impedance, and a cell inter-terminal voltage, the device comprising:

a charging circuit configured to supply a charging electrical current to the secondary cell to charge the secondary cell, and to cause the cell inter-terminal voltage to increase above the cell internal voltage over time in accordance with a charging transient characteristic;

the charging circuit being interrupted in operation to discharge the secondary cell and cause the cell inter-terminal voltage to decrease towards the cell internal voltage over time in accordance with a rest time transient characteristic;

a voltage detector connected across the secondary cell and configured to measure the cell inter-terminal voltage at predetermined sampling frequencies over the rest time transient characteristic;

a storage unit configured to store potential differences between the cell inter-terminal voltage and the cell internal voltage at the sampling frequencies over the rest time transient characteristic;

a calculating unit configured to integrate the stored potential differences to obtain an integration value; and a diagnosis unit configured to diagnose the cell deterioration of the secondary cell based on the integrated value.

4. The cell deterioration diagnostic device according to claim 3, wherein the calculating unit is configured to correct the integrated value to a corrected integrated value by using a correction function that exponentially increases as an ambient temperature of the secondary cell increases, and wherein the diagnosis unit diagnoses the cell deterioration based on the corrected integrated value.

* * * * *